United States Patent
Walker et al.

(10) Patent No.: US 6,386,951 B2
(45) Date of Patent: *May 14, 2002

(54) METHODS OF POLISHING MATERIALS, METHODS OF SLOWING A RATE OF MATERIAL REMOVAL OF A POLISHING PROCESS, AND METHODS OF FORMING TRENCH ISOLATION REGIONS

(75) Inventors: Michael A. Walker; Karl M. Robinson, both of Boise, ID (US)

(73) Assignee: Micron Technology, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/775,788

(22) Filed: Feb. 1, 2001

Related U.S. Application Data

(62) Division of application No. 09/017,521, filed on Feb. 2, 1998, now Pat. No. 6,224,466.

(51) Int. Cl.[7] ............................................. C03L 15/02
(52) U.S. Cl. ............................ 451/41; 451/36; 451/285
(58) Field of Search ............................. 451/36, 41, 285

(56) References Cited

U.S. PATENT DOCUMENTS

| | | |
|---|---|---|
| 5,533,923 A | 7/1996 | Shamouilian et al. |
| 5,560,802 A | 10/1996 | Chisholm |
| 5,575,706 A | 11/1996 | Tsai et al. |
| 5,582,534 A | 12/1996 | Shendon et al. |
| 5,637,031 A | 6/1997 | Chen |
| 5,643,050 A | 7/1997 | Chen |
| 5,643,406 A | 7/1997 | Shimomura et al. |
| 5,672,095 A | 9/1997 | Morimoto et al. |
| 5,676,587 A | 10/1997 | Landers et al. |
| 5,688,360 A | 11/1997 | Jairath |
| 5,707,274 A | 1/1998 | Kim et al. |
| 5,707,492 A | 1/1998 | Stager et al. |
| 5,855,804 A | 1/1999 | Walker |
| 5,888,120 A | 3/1999 | Doran |
| 5,990,012 A | 11/1999 | Robinson et al. |
| 5,994,224 A | 11/1999 | Sandhu et al. |
| 6,045,435 A | 4/2000 | Bajaj et al. |
| 6,062,968 A | 5/2000 | Sevilla et al. |
| 6,224,466 B1 * | 5/2001 | Walker et al. ............... 451/285 |

OTHER PUBLICATIONS

Cheng, J., et al., "A Novel Planarization of Trench Isolation Using a Polysilicon Layer As a Self–Aligned Mask", Extended Abstracts, 1995 Internatl. Conf. on Solid State Devices and Materials, Osaka, pp. 896–897.

* cited by examiner

*Primary Examiner*—Allen Ostrager
*Assistant Examiner*—William Hong
(74) *Attorney, Agent, or Firm*—Wells St. John P.S.

(57) ABSTRACT

The invention includes polishing processes, methods of polishing materials, methods for slowing a rate of material removal of a polishing process, and methods of forming trench isolation regions. In one aspect, the invention includes a method comprising: a) forming a material over a surface of a substrate; b) providing a substantially nonporous polishing pad and a chemical composition proximate the material, the material being substantially wettable to the chemical composition, the substrate surface and substantially non-porous polishing pad being substantially non-wettable to the chemical composition; and c) polishing the material with the substantially non-porous polishing pad and the chemical composition. In another aspect, the invention includes a method comprising: a) forming a first silicon dioxide layer over a substrate; b) forming a polysilicon layer over the first silicon dioxide layer, the polysilicon layer having an upper surface; c) forming an opening through the polysilicon layer, through the first silicon dioxide layer, and into the substrate; d) forming a second layer of silicon dioxide within the opening and over the polysilicon layer upper surface, the second layer of silicon dioxide substantially completely filling the opening; and e) polishing the second silicon dioxide from over the polysilicon layer upper surface utilizing a substantially non-porous hydrophobic material polishing pad and a water-comprising chemical composition.

17 Claims, 5 Drawing Sheets

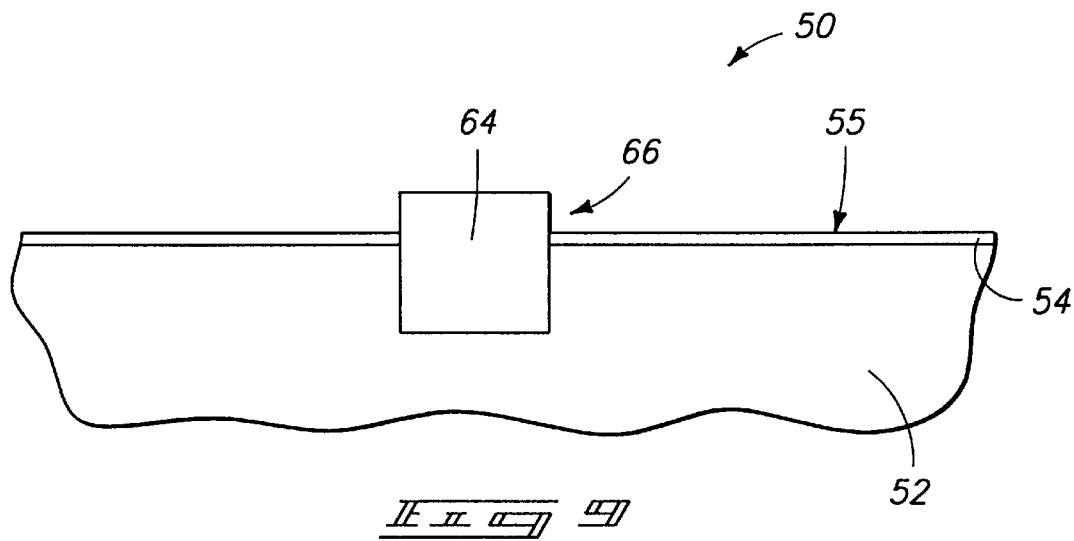
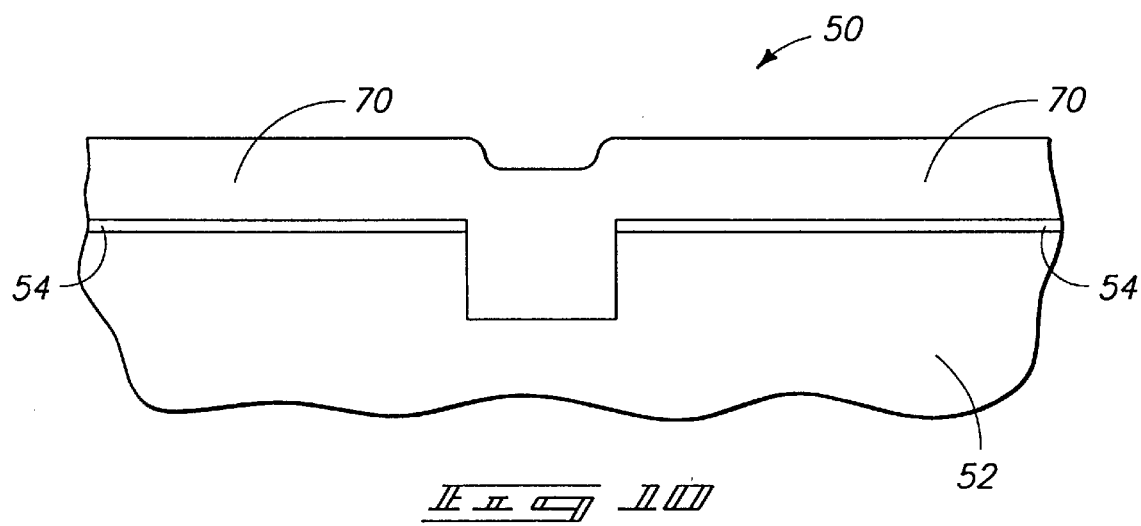

METHODS OF POLISHING MATERIALS, METHODS OF SLOWING A RATE OF MATERIAL REMOVAL OF A POLISHING PROCESS, AND METHODS OF FORMING TRENCH ISOLATION REGIONS

RELATED PATENT DATA

This patent is a Divisional Application of U.S. patent application Ser. No 09/017,521, filed Feb. 2, 1998, now U.S. Pat. No. 6,224,466, entitled "Methods of Polishing Materials, Methods Of Slowing A Rate of Material Removal Of A Polishing Process", naming Michael A. Walker and Karl M. Robinson, as inventors, the dislosure of which is incorporated by reference.

TECHNICAL FIELD

This invention pertains to methods of polishing materials in semiconductor assemblies and to methods of slowing a rate of material removal of a polishing process during formation of semiconductor assemblies.

BACKGROUND OF THE INVENTION

In modern semiconductor device applications, hundreds of individual devices may be packed onto a single small area of a semiconductor substrate. Many of these individual devices may need to be electrically isolated from one another. One method of accomplishing such isolation is to form a trenched isolation region between adjacent devices. Such trenched isolation region will generally comprise a trench or cavity formed within the substrate and be filled with an insulative material, such as silicon dioxide.

Prior art methods of forming trench structures are described with reference to FIGS. 1–4. Referring to FIG. 1, a semiconductor wafer fragment 10 is shown at a preliminary stage of a prior art processing sequence. Wafer fragment 10 comprises a semiconductive material 12 upon which is formed a layer of oxide 14, a layer of nitride 16, and a patterned layer of photoresist 18. Nitride layer 16 comprises an upper surface 17, upon which photoresist layer 18 is supported. Semiconductive material 12 commonly comprises monocrystalline silicon which is lightly doped with a conductivity enhancing dopant.

Referring to FIG. 2, patterned photoresist layer 18 is used as a mask for an etching process. During the etch, unmasked portions of nitride layer 16, oxide layer 14, and semiconductive material 12 are removed to form a trench 20 extending within the semiconductive material 12.

Referring to FIG. 3, photoresist layer 18 is removed. Subsequently, an oxide fill layer 24 is formed over nitride layer 16 and within trench 20.

Referring to FIG. 4, layer 24 is removed, generally by an abrasion technique such as chemical-mechanical polishing (CMP), inwardly to about upper surface 17 of nitride layer 16. Such polishing forms an oxide plug 26 within the semiconductor material 12.

A difficulty of polishing processes can be in stopping the polishing process at a desired level, such as at about upper surface 17. It would therefore be desirable to develop improved polishing processes, and to apply such polishing processes toward developing improved processes of forming field isolation regions.

SUMMARY OF THE INVENTION

The invention encompasses polishing processes, methods of polishing materials, methods of slowing a rate of material removal of a polishing process, and methods of forming trench isolation regions.

In one aspect, the invention encompasses a method for polishing a material in which the material is formed over a surface of a substrate. A chemical composition and a substantially non-porous polishing pad are provided proximate to the material. The material is substantially wettable to the chemical composition, while the substrate surface and substantially non-porous polishing pad are substantially non-wettable to the chemical composition. The material is polished with the substantially non-porous polishing pad and chemical composition to expose at least some of the surface of the substrate.

In another aspect, the invention encompasses a method for slowing a rate of material removal of a polishing process at a surface. A first layer having an upper surface is formed over a substrate. A second layer is formed over the first layer upper surface. The second layer is more hydrophilic than the first layer. After the second layer is formed, a substantially non-porous hydrophobic material polishing pad and a water-comprising chemical composition are utilized to polish to the first layer upper surface.

In yet another aspect, the invention encompasses a method of forming a trench isolation region. A first silicon dioxide layer is formed over a semiconductive material substrate. A polysilicon layer having an upper surface is formed over the first silicon dioxide layer. An opening is formed through the polysilicon layer, through the first silicon dioxide layer, and into the semiconductive material substrate. A second layer of silicon dioxide is formed within the opening and over the polysilicon layer upper surface. The second layer of silicon dioxide substantially completely fills the opening. The second layer of silicon dioxide is polished from over the polysilicon layer upper surface utilizing a substantially non-porous hydrophobic material polishing pad and a water-comprising chemical composition. The polishing removes the silicon dioxide at a material-removal rate. The material-removal rate slows upon reaching about the polysilicon layer upper surface. After the polishing, a plug of silicon dioxide remains within the opening in the semiconductive substrate. The plug is a trench isolation region.

BRIEF DESCRIPTION OF THE DRAWINGS

Preferred embodiments of the invention are described below with reference to the following accompanying drawings.

FIG. 9 shows the FIG. 5 wafer fragment at a processing step subsequent to that of FIG. 8, processed according to a first embodiment of the present invention.

FIG. 10 shows the FIG. 5 wafer fragment at a processing step subsequent to FIG. 8, processed according to a second embodiment of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
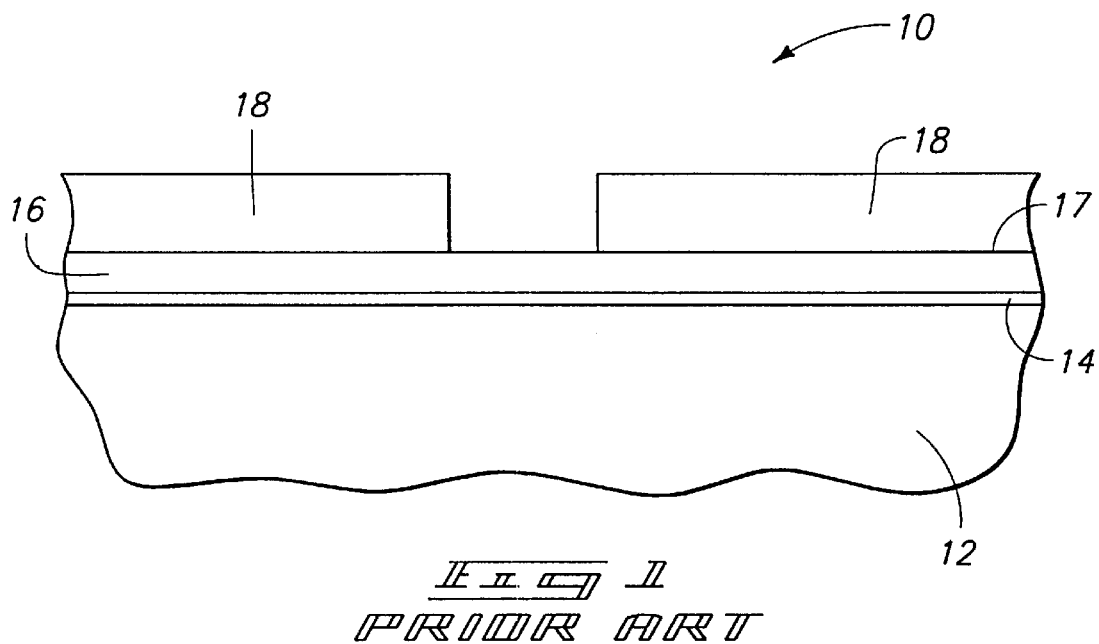
FIG. 1 is a schematic, cross-sectional, fragmentary view of a semiconductor wafer fragment at a preliminary processing step in accordance with a prior art processing sequence.
Figure 2:
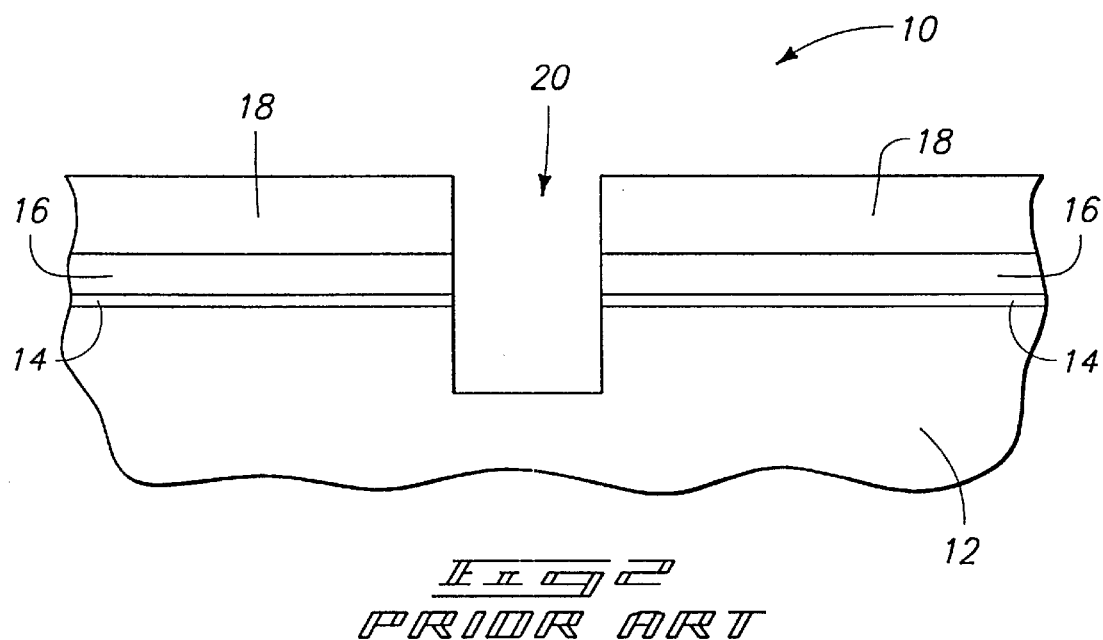
FIG. 2 shows the FIG. 1 wafer fragment at a prior art processing step subsequent to that of FIG. 1.
Figure 3:
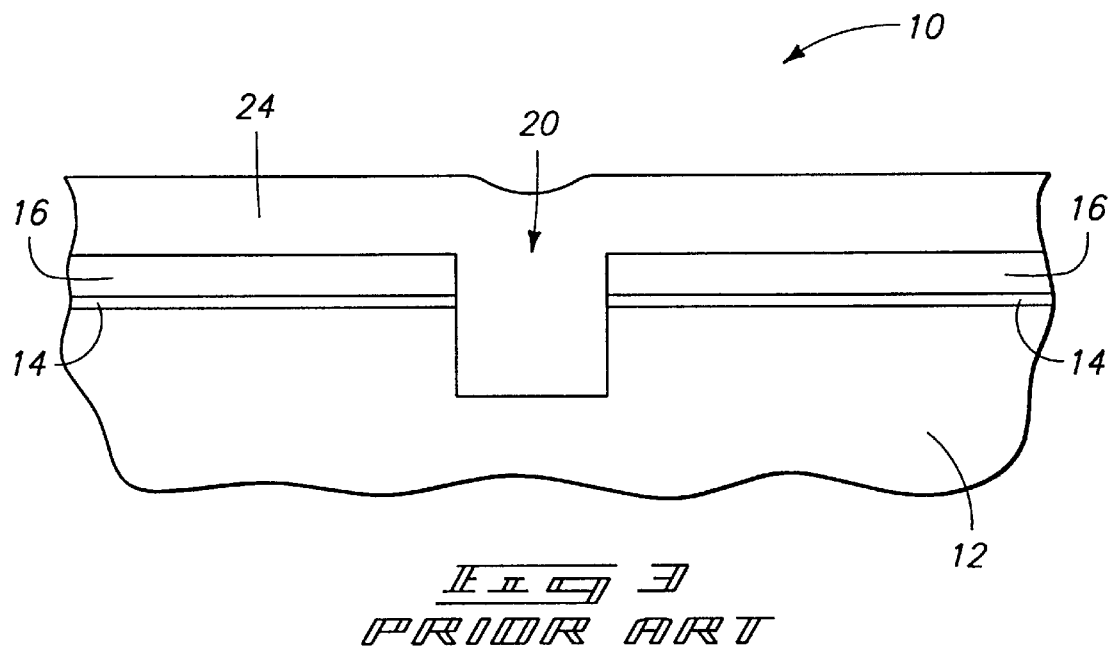
FIG. 3 shows the FIG. 1 wafer fragment at a prior art processing step subsequent to that of FIG. 2.
Figure 4:
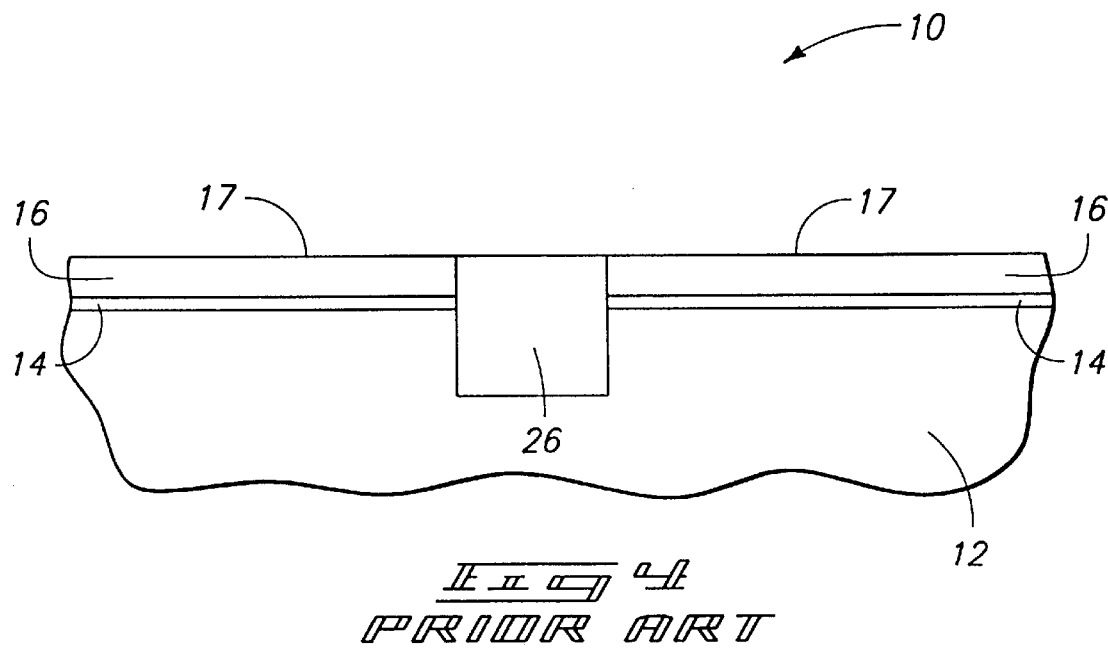
FIG. 4 shows the FIG. 1 wafer fragment at a prior art processing step subsequent to that of FIG. 3.
Figure 5:
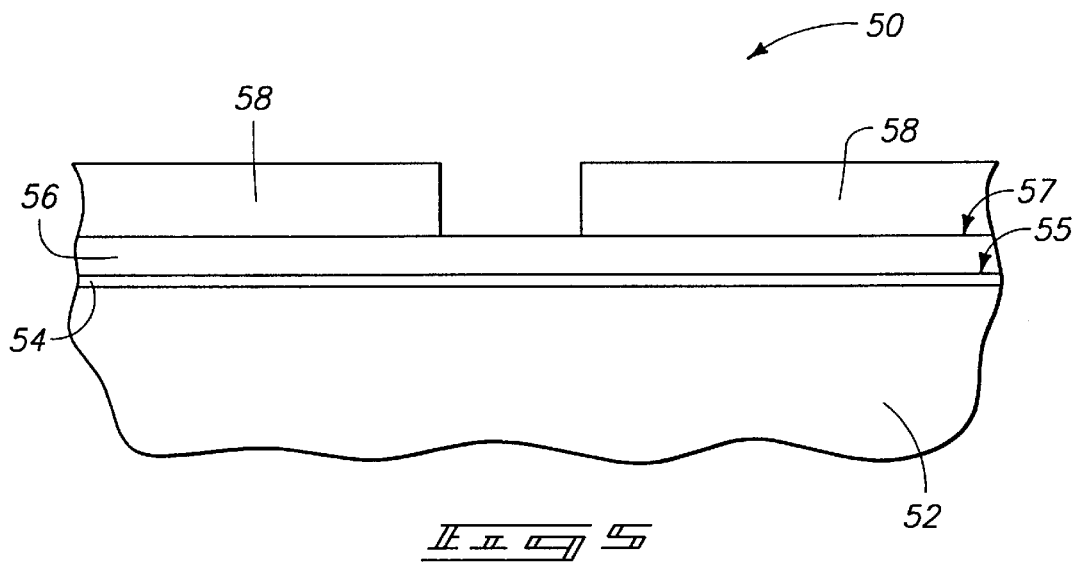
FIG. 5 is a schematic, cross-sectional, fragmentary view of a semiconductor wafer fragment at a preliminary processing step of a method of the present invention.

One preferred embodiment of the present invention is described with reference to FIGS. 5–10. Referring first to FIG. 5, a wafer fragment 50 is illustrated at a preliminary step of a method of the present invention. Wafer fragment 50 comprises a semiconductive substrate 52 upon which is formed a pad layer 54, a first material layer 56, and a patterned masking layer 58. Pad layer 54 comprises an upper surface 55 over which is formed first material layer 56, and first material layer 56 comprises an upper surface 57 over which is formed patterned masking layer 58. Patterned masking layer 58 covers a portion of first material layer 56, and leaves a portion of layer 56 exposed.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. For instance, the term "substrate" could encompass material 52 and/or one or both of layers 54 and 56.

Semiconductive substrate 52 may comprise, for example, monocrystalline silicon which is lightly doped with a conductivity-enhancing dopant. Pad layer 54 preferably comprises a material which is selectively etchable relative to semiconductive substrate 52. Pad layer 54 may alternatively be referred to as an intermediate layer 54. First material layer 56 preferably comprises a material which is substantially non-wettable by a polishing solution under conditions which will be described in more detail below. In a particular embodiment of the present invention, semiconductive substrate 52 comprises monocrystalline silicon, pad layer 54 comprises silicon dioxide, and first material layer 56 comprises polysilicon. Patterned masking layer 58 can comprise, for example, photoresist.

Figure 6:
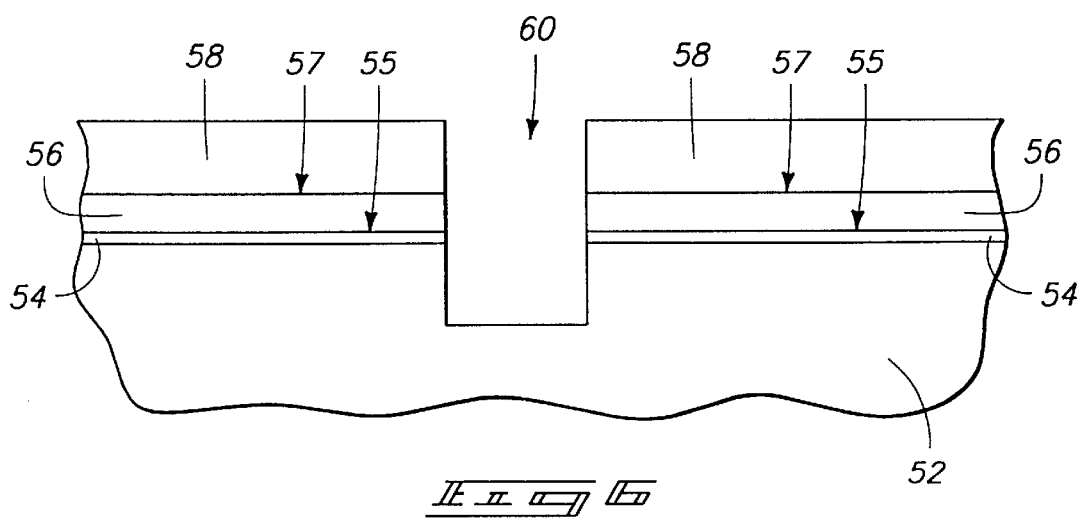
FIG. 6 shows the FIG. 5 wafer fragment at a processing step subsequent to that of FIG. 5.

Referring to FIG. 6, an opening 60 is formed through layers 54 and 56, and into substrate 52. Opening 60 is formed by removing portions of layer 56, layer 54 and semiconductive substrate 52 exposed through patterned photoresist 58. Opening 60 can be formed by methods known to persons of ordinary skill in the art. Such methods will vary, depending on the composition of semiconductive substrate 52 and layers 54 and 56. For instance, if semiconductive substrate 52 comprises monocrystalline silicon, layer 54 comprises silicon dioxide, and layer 56 comprises polysilicon, opening 60 can be formed by a wet etch.

Figure 7:
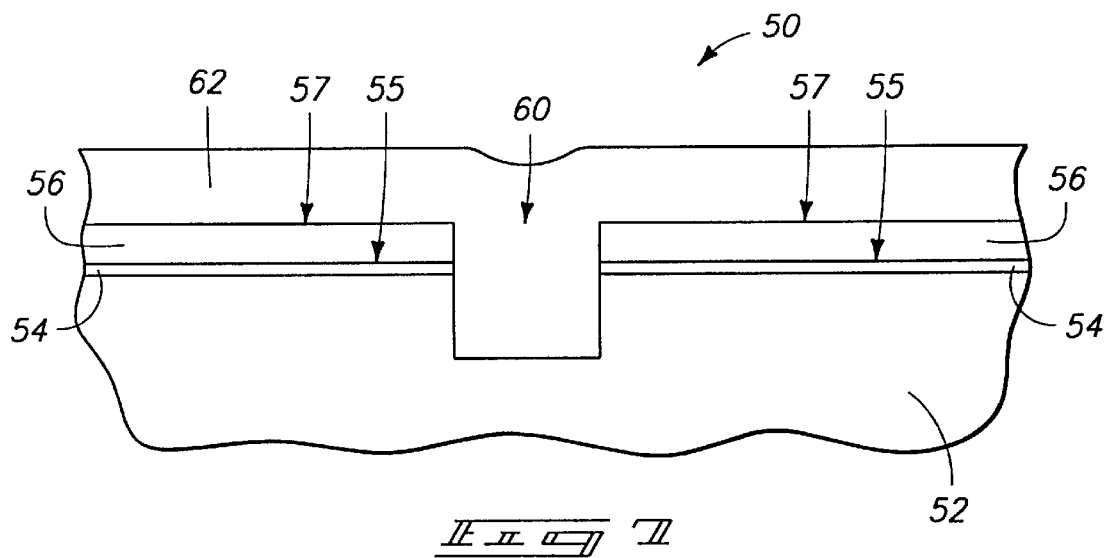
FIG. 7 shows the FIG. 5 wafer fragment at a processing step subsequent to that of FIG. 6.

Referring to FIG. 7, photoresist masking layer 58 is removed and a second material layer 62 is formed outwardly of layer 56 and within opening 60. Second material layer 62 may alternatively be referred to as a plug layer 62. In methods of forming a trench isolation region, plug material layer 62 will preferably comprise an insulative material. An example insulative material is silicon dioxide. Plug material layer 62 can be formed by conventional methods.

Figure 8:
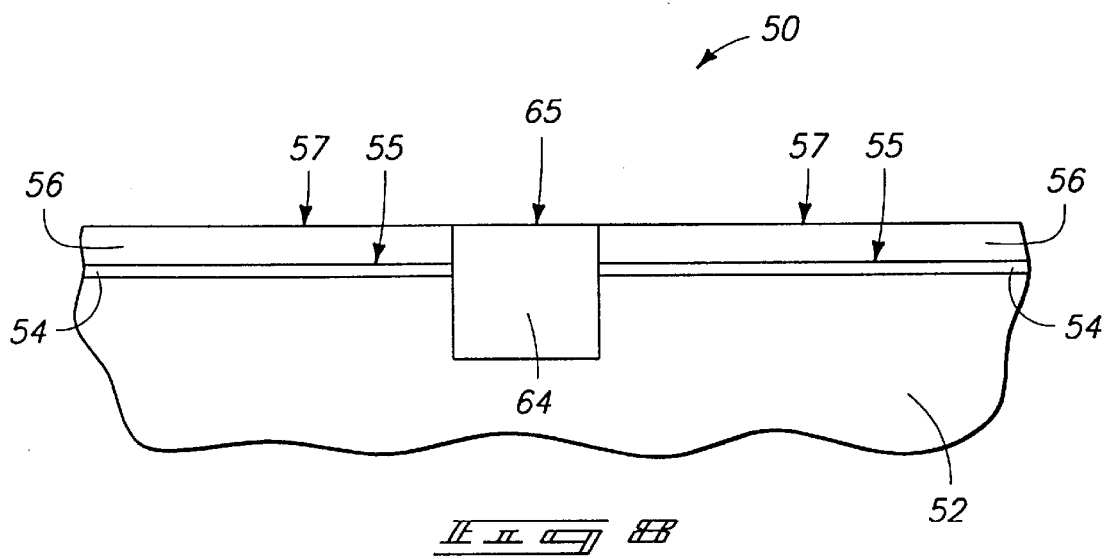
FIG. 8 shows the FIG. 5 wafer fragment at a processing step subsequent to that of FIG. 7.

Referring to FIG. 8, plug material 62 is removed from over first material layer upper surface 57 by a polishing method. In accordance with the present invention, layer 62 is polished utilizing a substantially non-porous material polishing pad and a chemical composition to which layer 62 is substantially wettable and to which layer 56 and the polishing pad material are substantially non-wettable. For instance, in applications in which layer 62 comprises a substantially hydrophilic material, such as silicon dioxide, and layer 56 comprises a substantially hydrophobic material, such as polysilicon, an exemplary chemical composition of the present invention will be aqueous and pH about 11. Polishing particles, such as alumina or silica, could of course also be provided.

The polishing removes material of layer 62 exposed to the polishing pad at a material-removal rate. After enough of the material of layer 62 is removed, at least some of upper surface 57 of layer 56 is exposed to the polishing pad. The material of layer 62 exposed to the polishing pad is less readily removed by the polishing pad after upper surface 57 is exposed to the polishing pad. Thus, the material-removal rate slows after the upper surface 57 of layer 56 is exposed to the polishing pad. The material-removal rate can continue to slow as the amount of surface 57 exposed to the polishing pad increases relative to the amount of layer 62 exposed to the pad. The material-removal rate can slow to zero, or about zero, if a sufficient amount of surface 57 is exposed to the polishing pad.

One possible mechanism of the invention is that the substantially non-porous, substantially non-wettable polishing pad and substantially non-wettable layer 56 inhibit the chemical composition from seeping between the pad and layer 56, and actually repel the chemical composition therefrom. The material-removal rate becomes about zero when the chemical composition is no longer between the polishing pad and layer 62. A polishing method which would likely substantially stop removing material when a chemical composition is no longer between a polishing pad and an underlying material is, for example, a chemical-mechanical polishing method. It is noted, however, that the scope of the invention is to be limited only in accordance with the language of the claims that follow, properly interpreted in accordance with the doctrine of equivalents, and not solely by the mechanism discussed above.

The polishing of layer 62 substantially removes layer 62 from outwardly of layer 56 and leaves a plug 64 within opening 60 (shown in FIG. 7). Plug 64 preferably comprises a substantially planar upper surface 65 which is substantially co-planar with upper surface 57 of layer 56. In applications in which plug 64 comprises an insulative material, such as, for example, silicon dioxide, plug 64 can be a trench isolation region.

FIGS. 9 and 10 illustrate two alternative processing embodiments which can occur after formation of a trench isolation, or other, region 64. In the embodiments of FIGS. 9 and 10, trench isolation region 64 comprises silicon dioxide, first material layer 56 comprises polysilicon, and pad layer 54 comprises a material to which polysilicon is selectively etchable, such as silicon dioxide.

Referring to FIG. 9, polysilicon layer 56 (shown in FIG. 8) is selectively removed from over layer 54 to leave a step 66 of plug 64 exposed outwardly of upper surface 55 of layer 54. Methods for selectively removing polysilicon layer 56 will vary depending upon the composition of pad layer 54. An example method when pad layer 54 comprises silicon dioxide would be a wet etch utilizing KOH or $NH_4OH$.

Referring next to FIG. 10, polysilicon layer 56 (shown in FIG. 8) can be oxidized to form an insulative silicon dioxide layer 70 over intermediate layer 54. Methods for oxidizing polysilicon layer 56 are known to persons of ordinary skill in the art and can comprise, for example, oxidation in a furnace utilizing an ambient comprising $O_2$ and $H_2O$.

Intermediate layer 54 is an optional layer. In embodiments, such as that of FIG. 9, wherein layer 56 is ultimately to be removed from over semiconductive substrate 52, layer 54 can be advantageous. For instance, layer 54 can enable a layer 56 to be selectively removed from over a semiconductive substrate 52 comprising a material to which layer 56 is not readily or easily selectively etchable. Such circumstance can occur if layer 56 comprises polysilicon and semiconductive substrate 52 comprises monocrystalline silicon. In such embodiments, optional layer 54 is preferably provided.

In embodiments in which layer 56 would be selectively etchable relative to semiconductive substrate 52, or in which layer 56 is not ultimately to be removed from over semiconductive substrate 52, layer 54 might not be provided. Such embodiments comprise, for example, the embodiment of FIG. 10 wherein layer 56 is polysilicon and ultimately oxidized to form an insulative material which remains on semiconductive substrate 52.

Although the invention has been described with layers 54 and 56 formed outwardly of semiconductive substrate 52, it is to be understood that in alternative applications, which are not shown, layers 54 and 56 could be eliminated. In such alternative applications, layer 62 could comprise a material substantially wettable to a chemical composition, and semiconductive substrate 52 and the polishing pad could comprise materials substantially non-wettable to the chemical composition.

Further, it is to be understood that, although the invention has been described in an application in which an opening was formed within a material, the invention has application to any method in which a material is to be selectively polished relative to another material. Such applications, as will be recognized by persons of ordinary skill in the art, extend beyond applications of forming and filling openings in materials.

Additionally, it is to be understood that, although the invention has been described in an application wherein a material which is to be polished (layer 62 in the above description) is formed over a substrate upper surface, the invention also applies to applications in which such material is formed outwardly of a substrate upper surface, without necessarily extending over the substrate upper surface. Such applications would include, for example, applications in which the material is formed as a pillar extending through an opening in a substrate and outwardly of a substrate upper surface.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted—in accordance with the doctrine of equivalents.

What is claimed is:

1. A method of polishing a hydrophilic material comprising:
    forming hydrophilic material within an opening in a substrate, the substrate having a hydrophobic surface, the hydrophilic material being formed outwardly of the hydrophobic surface; and
    polishing the hydrophilic material with a substantially non-porous hydrophobic material polishing pad and a water-comprising chemical composition to expose at least some of the hydrophobic surface.

2. The method of claim 1 wherein the hydrophilic material is formed over the hydrophobic surface of the substrate.

3. The method of claim 1, wherein polishing the hydrophobic material further comprises removing the hydrophobic material at a first removal rate.

4. The method of claim 3, wherein polishing the hydrophobic material further comprises the first removal rate slowing to a second removal rate as at least some of the surface of the substrate is exposed.

5. A method of slowing a polishing rate at a surface comprising:
    forming a first layer over a substrate, the first layer having an upper surface and comprising a first material;
    forming a second layer over the first layer upper surface and below the first layer upper surface, the second layer being more hydrophilic than the first layer and comprising a second material; and
    after forming the second layer, polishing the materials utilizing a substantially non-porous hydrophobic material polishing pad and a water-comprising chemical composition, the polishing removing second material exposed to the polishing pad at a material-removal rate, the material-removal rate slowing after etching to about the first layer upper surface.

6. The method of claim 5 wherein the first layer comprises polysilicon and the second layer comprises silicon dioxide.

7. A method of polishing a material comprising:
    blanket depositing a material within an opening in a substrate and outwardly of a surface of the substrate;
    providing a substantially non-porous polishing pad and a polishing solution proximate the material, the material being substantially wettable to the polishing solution, the substrate surface and substantially non-porous polishing pad being substantially non-wettable to the polishing solution; and
    polishing the material with the substantially non-porous polishing pad and the polishing solution to expose at least some of the surface of the substrate and form at least one isolated region of the material.

8. The method of claim 7 wherein the material is formed over the surface of the substrate.

9. The method of claim 7 wherein the material is hydrophilic.

10. The method of claim 7 wherein the material is not hydrophilic.

11. The method of claim 7, wherein polishing the materials further comprises removing the material at a first removal rate.

12. The method of claim 11, wherein polishing the material further comprises the first removal rate slowing to a second removal rate as at least some of the surface of the substrate is exposed.

13. A method of polishing a second material comprising:
    forming a second material outwardly of a first material outer surface and within an opening of the first material, the first material being more hydrophobic than the second material; and polishing the second material with a substantially non-porous hydrophobic material polishing pad and a water-comprising chemical composition, the polishing removing second material exposed to the polishing pad at a material-removal rate, the material-removal rate slowing after polishing inwardly to the first material outer surface.

14. The method of claim 13 wherein the material-removal rate becomes zero after polishing inwardly to the first material outer surface.

15. The method of claim 13 wherein the polishing comprises chemical-mechanical polishing.

16. The method of claim 13 wherein the first material comprises polysilicon and the second material comprises silicon dioxide.

17. The method of claim 13 wherein the first material comprises polysilicon, the second material comprises silicon dioxide and the water-comprising chemical composition comprises polishing particles and a pH of about 11.

* * * * *